(12) United States Patent
Cheng et al.

(10) Patent No.: US 7,258,703 B2
(45) Date of Patent: Aug. 21, 2007

(54) APPARATUS AND METHOD FOR ALIGNING DEVICES ON CARRIERS

(75) Inventors: Chi Wah Cheng, Tsing Yi (CN); Hoi Shuen Joseph Tang, Lantau Island (CN); Tim Wai Tony Mak, Chai Wan (CN); Chi Hang Leung, Kowloon (CN)

(73) Assignee: ASM Assembly Automation Ltd., Hong Kong (HK)

( * ) Notice: Subject to any disclaimer, the term of this patent is extended or adjusted under 35 U.S.C. 154(b) by 0 days.

(21) Appl. No.: 11/031,024

(22) Filed: Jan. 7, 2005

(65) Prior Publication Data

US 2006/0154386 A1      Jul. 13, 2006

(51) Int. Cl.
*H01L 21/00* (2006.01)

(52) U.S. Cl. .................... 29/25.01; 206/701; 206/557; 206/706; 206/713; 438/106; 438/107

(58) Field of Classification Search .................. 438/15, 438/106, 107; 206/701, 557, 706, 713; 29/25.01
See application file for complete search history.

(56) References Cited

U.S. PATENT DOCUMENTS

| | | | |
|---|---|---|---|
| 3,870,416 A | * 3/1975 | Brady et al. ................. 356/138 |
| 5,688,127 A | 11/1997 | Staab et al. .................... 439/66 |
| 5,697,748 A | * 12/1997 | Somekh et al. ............. 414/217 |
| 6,067,235 A | * 5/2000 | Finn et al. ................... 361/814 |
| 6,338,297 B1 | 1/2002 | Wang et al. ................. 101/126 |
| 6,716,364 B1 | * 4/2004 | Chiesl et al. .................. 216/84 |
| 2003/0017629 A1 | * 1/2003 | Tsui et al. ..................... 438/14 |
| 2003/0042626 A1 | 3/2003 | Howarth ..................... 257/797 |
| 2005/0072714 A1 | * 4/2005 | Eleveld ....................... 206/701 |

FOREIGN PATENT DOCUMENTS

JP      03133784 A   *  6/1991

* cited by examiner

*Primary Examiner*—Michelle Estrada
*Assistant Examiner*—Jarrett J Stark
(74) *Attorney, Agent, or Firm*—Ostrolenk, Faber, Gerb & Soffen, LLP

(57) ABSTRACT

An apparatus and method are provided for aligning a plurality of semiconductor devices placed on a carrier. Alignment guides are located adjacent to each device in use, and arranged such that they correspond to a desired alignment of each semiconductor device. For alignment, the semiconductor devices are held by a positioning device comprising a plurality of holders, each holder being configured to generate a force to hold a semiconductor device. Actuators are also provided that are operative to move the positioning device and holders to bias the semiconductor devices against the alignment guides to orientate the semiconductor devices until they are aligned with said alignment guides.

16 Claims, 7 Drawing Sheets

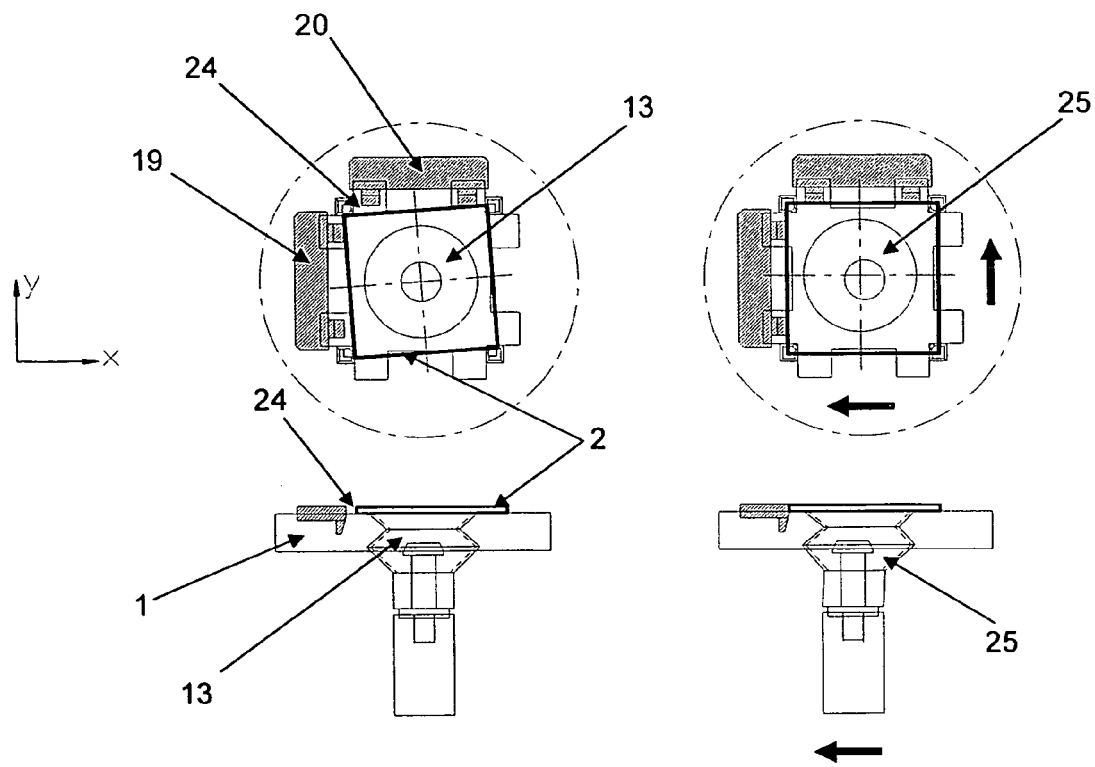
FIG. 7A  FIG. 7B
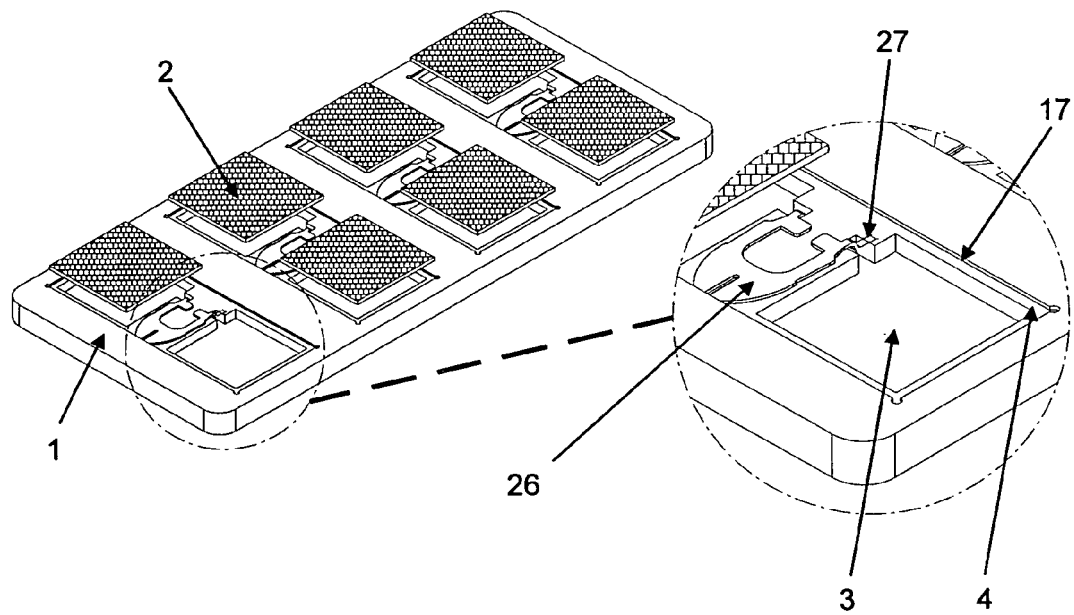
FIG. 8

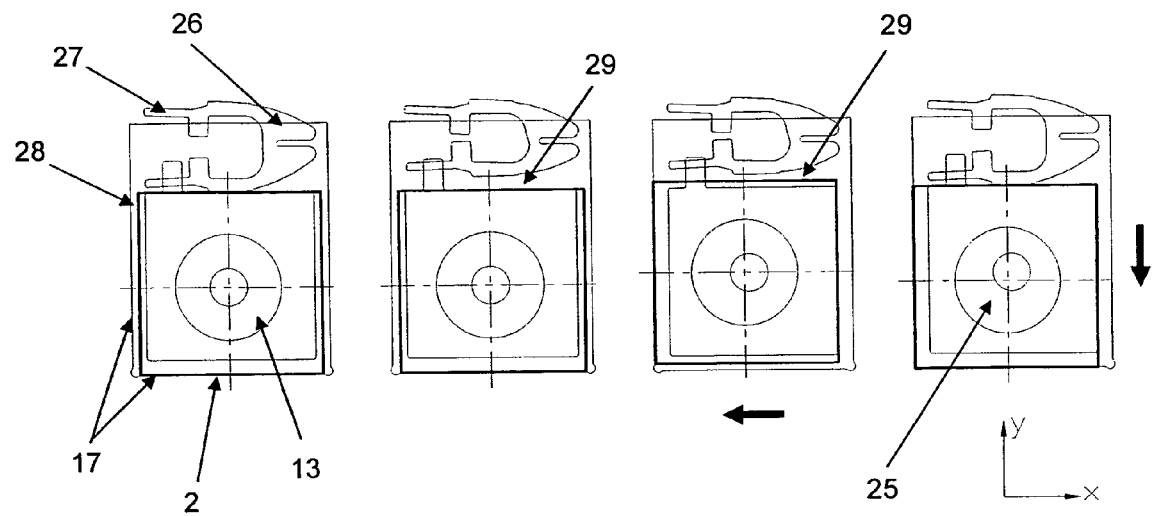
FIG. 9A  FIG. 9B  FIG. 9C  FIG. 9D
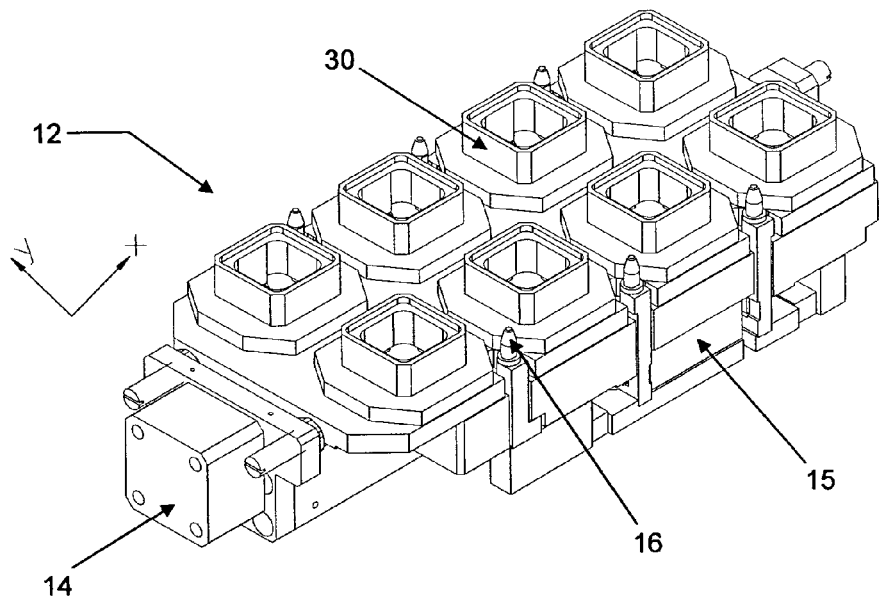
FIG. 10

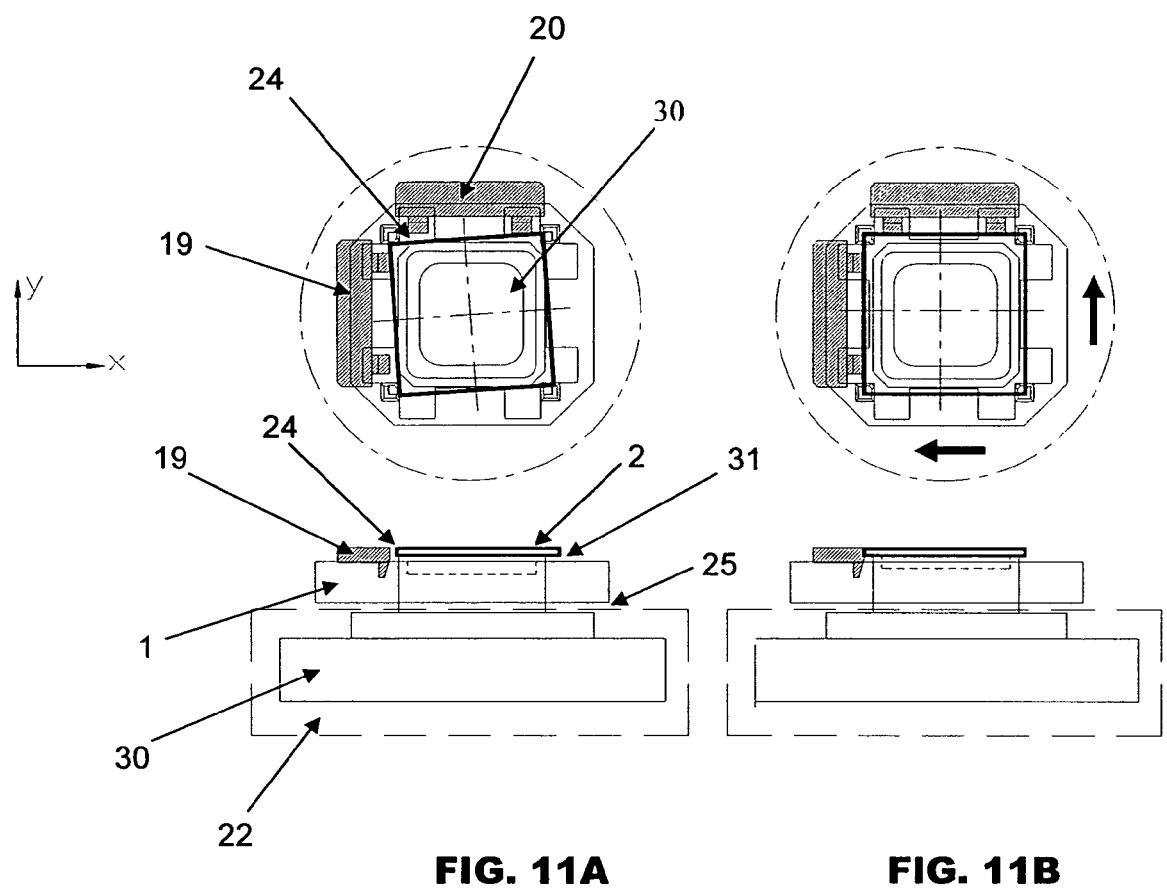
FIG. 11A  FIG. 11B

APPARATUS AND METHOD FOR ALIGNING DEVICES ON CARRIERS

FIELD OF THE INVENTION

The invention relates to the placement of semiconductor devices on carriers for various purposes such as for transportation or processing, and in particular, to the alignment of the semiconductor devices on said carriers.

BACKGROUND AND PRIOR ART

Semiconductor devices such as Ball Grid Array ("BGA") packages are usually small in size and are transported and/or processed in batches so as to increase operation efficiency. Thus, they are often loaded in a carrier in array form for transportation and processing. Examples of processes carried out on BGA packages arranged in array form include solder paste printing, solder balls attaching and testing. Processing of several or all semiconductor devices in a carrier simultaneously results in high throughput, but that in turn requires precise alignment of the devices in the carrier prior to processing. Poor alignment of the devices will directly affect the yield of processes subsequent to alignment. Alignment capability and accuracy becomes even more critical for fine pitch devices.

Various approaches have been implemented in the prior art to align semiconductor devices on carriers. In a cavity approach, a guiding plate with a cavity opened for receiving a semiconductor device is used for aligning it with respect to edges of the device. In U.S. Pat. No. 5,688,127 entitled "Universal Contactor System for Testing Ball Grid Array (BGA) Devices on Multiple Handlers and Method Therefor", a cavity approach is described wherein a guide plate has a cavity that is adapted to receive a BGA package for alignment. The opening size of the cavity is reduced gradually from the device entrance point to the inner portion of the cavity. The BGA package is guided by the narrowing opening and is aligned with the interior walls of the cavity at the inner portion.

A problem with this approach is that a clearance must exist between the BGA package and interior walls of the cavity to avoid jamming of the device. Also, additional clearance should be added to accommodate any variation in sizes of different BGA packages resulting from a prior singulation process. The resultant clearance between the BGA package and cavity may result in poor alignment. Furthermore, the guiding interaction between the interior walls of the cavity and BGA packages may cause potential tilting or dislocation of packages especially if the initial misalignment is large.

Alternatively, in a pin approach, two or more pins are used to align semiconductor devices with respect to a carrier, with apertures formed in both the devices and the carrier for the pins to pass through for alignment. The pin approach to align semiconductor devices with respect to a carrier is described in U.S. Pat. No. 6,338,297 entitled "Precise and Rapid Positioning Mechanism for Stencil Printing" and US patent publication number 2003/042626A1 entitled "Method of Ball Grid Array (BGA) Alignment, Method of Testing, Alignment Apparatus and Semiconductor Device Assembly". According to the pin approach, two or more apertures are formed in each semiconductor device, with the carrier having the same pattern of apertures at each landing site for the semiconductor devices. Apertures in the semiconductor devices and carrier are pre-aligned, with pins passing through the apertures of both parts to assist alignment.

This approach has the shortcoming that holes have to be formed in the semiconductor devices, which reduces the area available for placing input/output connections. Also, the holes reduce the area available for a suction cup to pick up the devices during pick-and-place operations using vacuum suction. Another shortcoming is that unless the pins and apertures in both semiconductor devices and carriers have minimal clearance, precise alignment cannot be achieved. However, it becomes very difficult, if not impossible, to align a plurality of semiconductor devices with the carrier by automated means if the pins and apertures are of similar size so that they fit tightly. This may require manual alignment that is not preferable for high volume production. Even if automated means can be applied, the striking of the pins into corresponding apertures of unaligned semiconductor devices may cause potential tilting or dislocation.

SUMMARY OF THE INVENTION

It is therefore an object of the present invention to seek to provide an apparatus and method for aligning semiconductor devices on carriers that avoid the above disadvantages of the prior art.

According to a first aspect of the invention, there is provided an apparatus for aligning a plurality of semiconductor devices placed on a carrier, comprising: alignment guides located adjacent to each device in use, and arranged such that they correspond to a desired alignment of each semiconductor device; a positioning device comprising a plurality of holders, each holder being configured to generate a force to hold a semiconductor device; and actuators operative to move the positioning device and holders to bias the semiconductor devices against the alignment guides to orientate the semiconductor devices until they are aligned with said alignment guides.

According to a second aspect of the invention, there is provided a method for aligning a plurality of semiconductor devices placed on a carrier, comprising: locating alignment guides adjacent to each semiconductor device, the alignment guides being arranged such that they correspond to a desired alignment of each semiconductor device; holding each semiconductor device with a force generated from a holder amongst a plurality of holders comprised in a positioning device; and moving the positioning device and holders with actuators to bias the semiconductor devices against the alignment guides to orientate the semiconductor devices until they are aligned with said alignment guides.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of preferred embodiments of the apparatus and method for aligning semiconductor devices in accordance with the invention will now be described with reference to the accompanying drawings, in which:

FIGS. 7A-B show top and side views of a flexible suction cup of the push block performing alignment of a semiconductor device;

FIG. 8 is an isometric view of a carrier comprising grippers;

FIGS. 9A-D illustrate an operation sequence of a method for aligning semiconductor devices in a carrier comprising grippers;

FIG. 10 is an isometric view of a push block according to a second preferred embodiment of the invention, with rigid suction rings mounted on the push block for alignment of semiconductor devices; and FIGS. 11A-B show top and side views of a rigid suction ring of the push block performing alignment of a semiconductor device.

DETAILED DESCRIPTION OF THE PREFERRED EMBODIMENT

Figure 1:
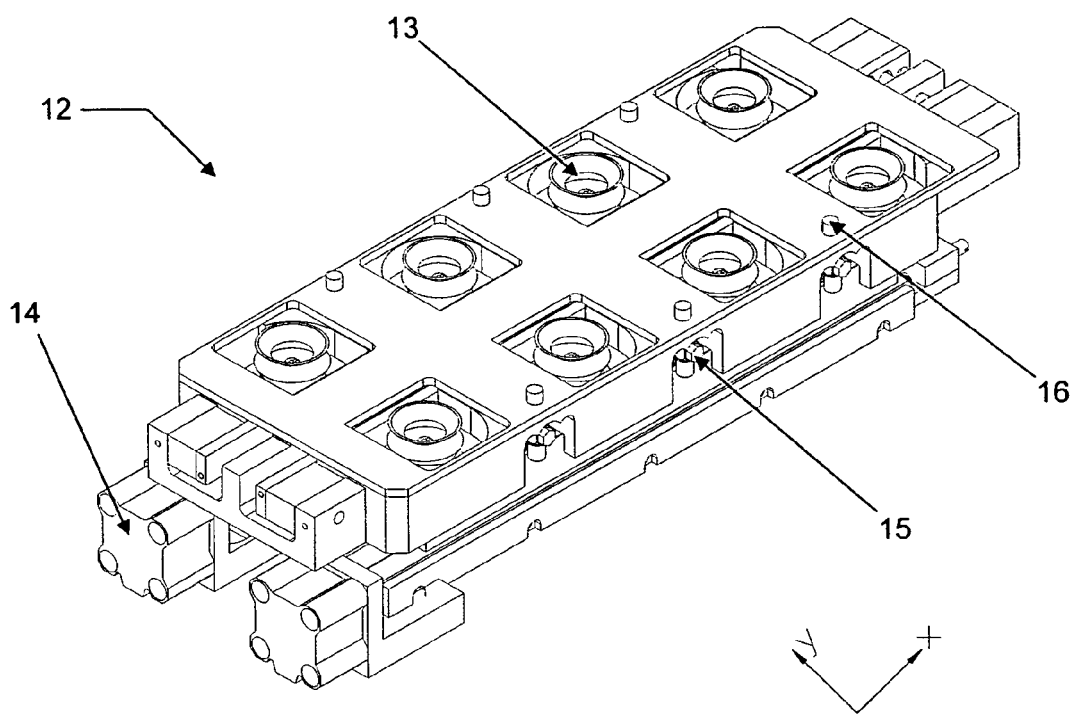
FIG. 1 is an isometric view of a push block according to a first preferred embodiment of the invention, with flexible suction cups mounted on the push block for alignment of semiconductor devices.

FIG. 1 is an isometric view of a positioning device, such as push block 12, according to a first preferred embodiment of the invention, with holders comprising resilient holding surfaces in the form of resilient and flexible suction cups 13 mounted on the push block 12 for alignment of semiconductor devices 2. Each holder is configured to generate a force to hold a semiconductor device 2. The push block 12 can be moved in both the X and Y directions by actuators, in the form of X and Y actuators 14, 15 respectively, during alignment.

In accordance with the said embodiment of the present invention, arrays of flexible suction cups 13 are mounted onto the push block 12 which can move in both the X and Y directions. Each semiconductor device 2 will be held by a suction cup 13 as the push block 12 is moved upwards by an elevator (not shown) into contact with the devices 2. Suction cup vacuum should be activated as the push block 12 is moved upward, so as to prevent the dislodgement of devices 2 from their positions on a carrier at the moment when the suction cup 13 contacts the devices 2. The softness of the flexible suction cups 13 further reduces the likelihood of dislodgement of the devices 2.

Figure 2:
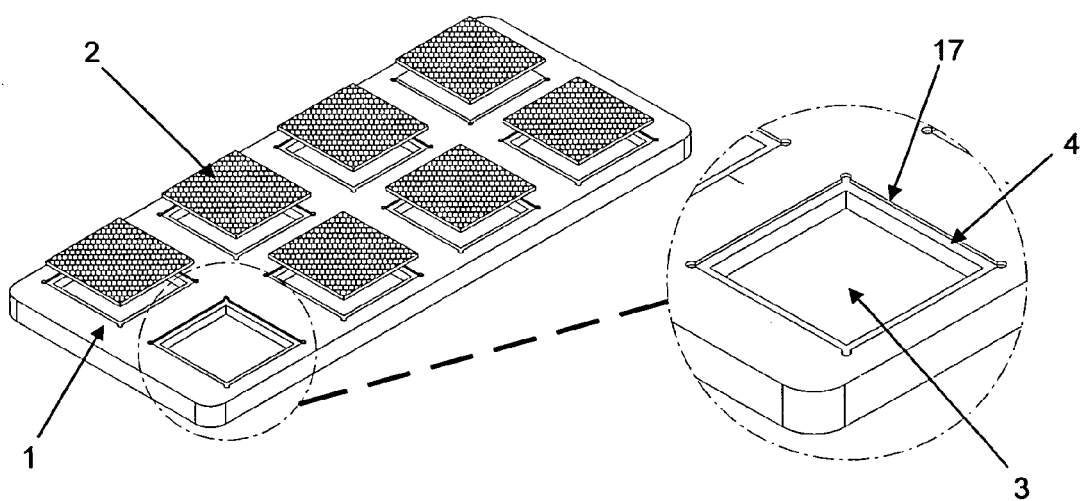
FIG. 2 is an isometric view of a carrier that incorporates reference edges for device alignment that are preformed into the carrier.

FIG. 2 is an isometric view of a carrier 1 that incorporates alignment guides in the form of reference edges 17 for device alignment that are preformed into the carrier 1. At least one pocket 3 is formed in the carrier 1 with each pocket 3 adapted to accommodate one semiconductor device 2. Each pocket 3 has a center opening for the flexible suction cups 13 to extend through the carrier 1 and hold the semiconductor devices 2 from the bottom of the carrier 1. Semiconductor devices 2 are supported on a support surface 4 of the pocket 3 and bounded within the pocket 3 by reference edges 17 protruding from the support surface 4.

The reference edges 17 are preformed into the carrier 1 with tight dimensional tolerance control. Two reference edges 17 are formed in each pocket 3 for alignment of each device 2 with one used for alignment in the X direction and the other used for alignment in the Y direction. The reference edges 17 can comprise guiding edges or points, formed with precise dimensional control, which are inherently built into the carrier 1. Alternatively, reference guides can be provided by a clamping plate or top clamp with pre-aligned guiding edges or points mounted.

Figure 3:
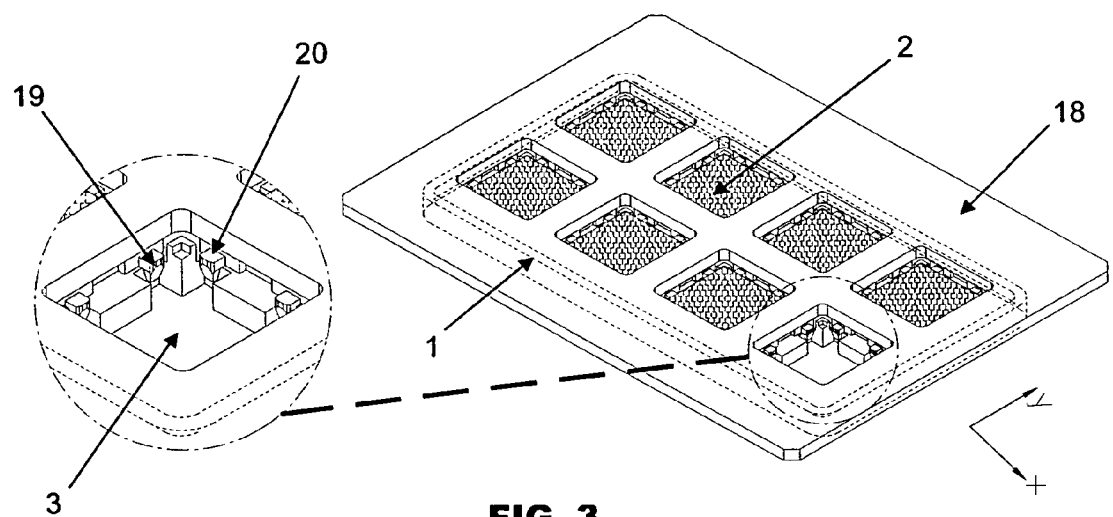
FIG. 3 is an isometric view of an upper surface of a top clamp that incorporates a plurality of pre-aligned guiding edges mounted onto the top clamp.

FIG. 3 is an isometric view of an upper surface of a clamping plate in the form of a top clamp 18 that incorporates a plurality of pre-aligned guiding edges 19, 20 mounted onto the top clamp 18. Each carrier pocket 3 is provided with two guiding edges 19, 20 when the top clamp 18 is placed onto the carrier, with one 19 responsible for aligning the device in the X direction and the other 20 for aligning the device in the Y direction.

Figure 4:
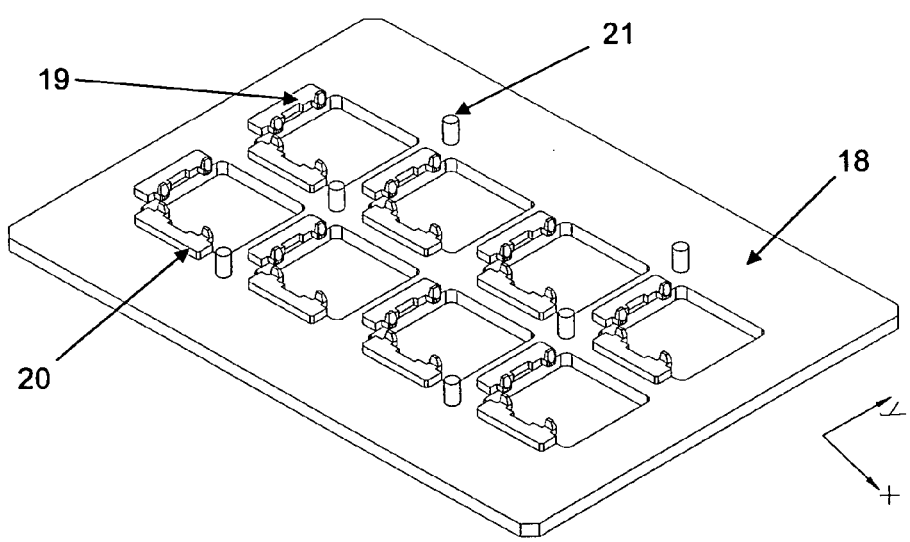
FIG. 4 is an isometric view of an underside of the top clamp that is adapted to engage an upper surface of the carrier.

FIG. 4 is an isometric view of an underside of the top clamp 18 that is adapted to engage an upper surface of the carrier 1. Some carriers such as plastic JEDEC trays may have large warpage after experiencing repeated reflow processes in an oven. This will create an uneven height for devices across the carrier 1. The consequence is that the suction cups 13 may not be able to reach some of the devices 2 which are much higher due to carrier warpage. Meanwhile, if the height of the push block 12 is raised to accommodate the heights of the above devices 2, suction cups 13 corresponding to pockets 3 at normal height may cause dislodgement of devices 2 from the pockets 3 due to excessive over-travel into the pockets 3. Therefore it is proposed to have a clamping mechanism apply a leveling force onto the carrier 1 prior to alignment.

Figure 5:
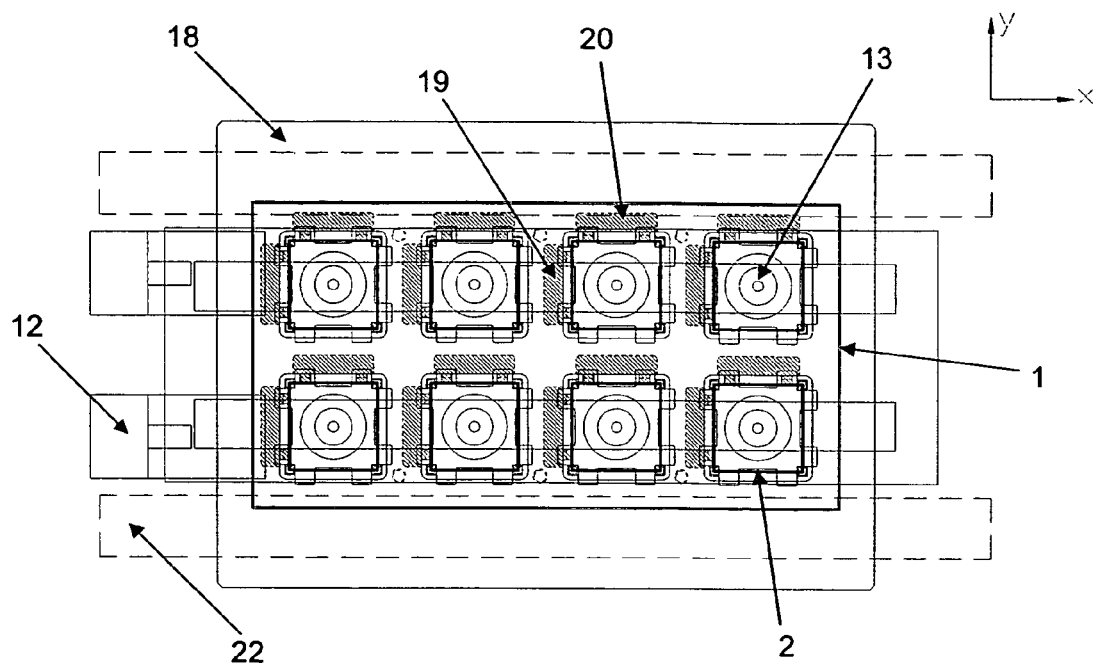
FIG. 5 is a plan view of the top clamp positioned over the carrier and push block.

Described below is a method to flatten or level the carrier 1. Flexible stoppers 21, for example air cylinder rods, are mounted onto the top clamp 18. With the carrier 1 resting on a conveyor track 22, the top clamp 18 is lowered down with the flexible stoppers 21 pressing against the carrier 1 from the top and thus flattening it against the conveyor track 22. Rigid pins 16 are mounted on the push block 12, preferably at positions near the flexible stoppers 21. FIG. 5 is a plan view of the top clamp 18 positioned over the carrier 1 and push block 12. As push block 12 moves up, the rigid pins 16 come in contact with the carrier 1 from the bottom and lift the carrier 1 from the conveyor track level to a plane at a defined height and coplanarity for device alignment and subsequent processing. One advantage is that the flexibility of the stoppers 21 provides damping for the carrier 1 when it comes into contact with the top clamp 18 and push block 12, to avoid devices 2 jumping out of the pockets 3 due to impact. Another advantage is that it allows the carrier 1 to be kept in a flattened state during its lifting from the conveyor track height to the defined level for alignment and processing.

Figure 6A:
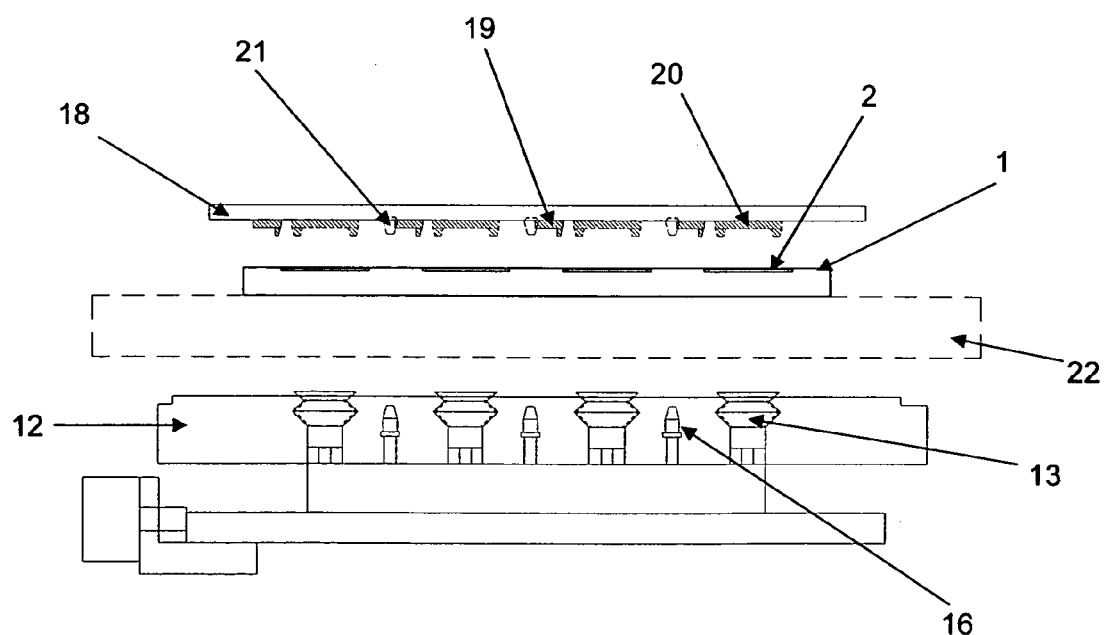
FIGS. 6A-D illustrate an operation sequence of a method for aligning the semiconductor devices in the carrier according to the first embodiment of the invention.

FIGS. 6A-D illustrate an operation sequence of a method for aligning the semiconductor devices 2 in the carrier 1 according to the first embodiment of the invention. In FIG. 6A, semiconductor devices 2 in the carrier 1 are transported to a position above the push block 12 and are placed on the conveyor track 22.

Figure 6B:
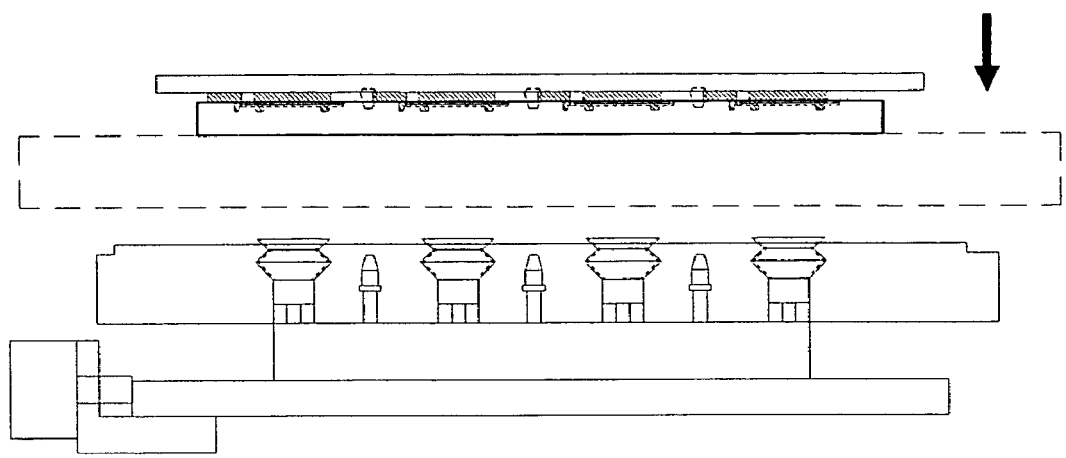

In FIG. 6B, a top clamp 18 with flexible stoppers 21 and guiding edges 19, 20 is lowered down to flatten the carrier 1 against the conveyor track 22. The flexibility of the stoppers 21 provides damping for the carrier 1 when it comes into contact with the top clamp 18, thus preventing devices 2 from jumping out of the carrier pockets 3.

Figure 6C:
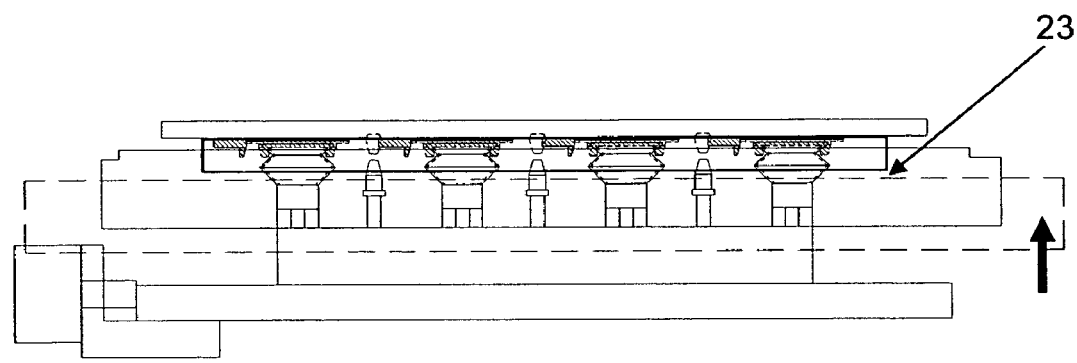

In FIG. 6C, with the suction cup 13 vacuum on, the push block 12 is moved upward by an elevator (not shown), to lift up the carrier 1 from the conveyor track 22 to a predetermined level by the rigid pins 16 towards the top clamp 18. Due to the flexibility of the stopper 21 in the top clamp 18, the carrier 1 can be always kept flat during the lifting of the carrier 1. At the same time, the semiconductor devices 2 are held by suction cups 13 against the support surface 4 of the carrier 1. There is a clearance 23 between the conveyor track 22 and the carrier 1.

Figure 6D:
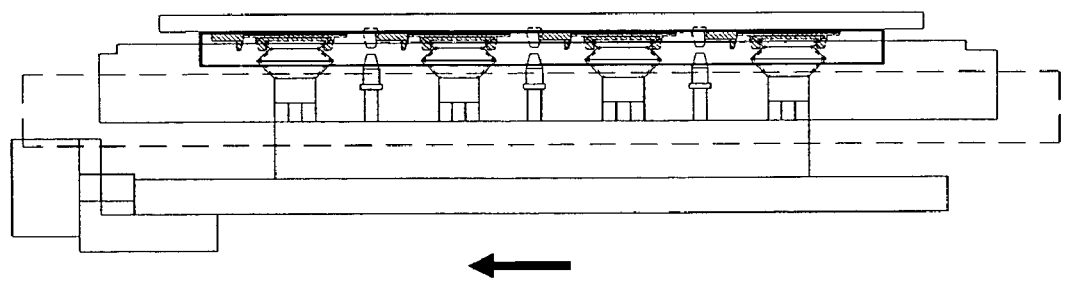

In FIG. 6D, the push block 12 travels in both the X and Y directions (not shown for the Y direction) by actuators 14, 15 aligned along the X and Y directions respectively such that the semiconductor devices 2 are biased by the push block and pulled by the suction cups 13 against the guiding edges 19, 20 in the top clamp 18 for alignment. The semiconductor devices are biased and orientated until they are aligned with the guiding edges 19, 20. Accordingly, the semiconductor devices 2 are arranged substantially on a plane on the carrier 1, and the actuators 14, 15 are operative to move the push block 12 and suction cups 13 along a plane that is substantially parallel to the plane on which the semiconductor devices 2 are arranged. Movement of the semiconductor devices 2 is facilitated by controlling the suction cup vacuum to an appropriate level to reduce the sliding friction between the devices 2 and support surface 4 of the carrier 1 for alignment.

Once the semiconductor devices 2 are aligned with the reference edges 17, suction cup vacuum is set to a high level to prevent dislocation of the semiconductor devices 2 in subsequent processing. Preferably, the top clamp 18 comprises openings corresponding to positions of the devices 2 on the carrier 1, whereby the devices 2 are accessible through the top clamp 18 after engagement of the top clamp 18 to the carrier 1.

FIGS. 7A-B show top and side views of a flexible suction cup 13 of the push block 12 performing alignment of a semiconductor device 2.

FIG. 7A shows the device 2 in a pocket 3 prior to alignment. A clearance 24 exists between the guiding edges 19, 20 and the semiconductor device 2. Prior to alignment of the semiconductor devices 2, vacuum pressure of the suction cup 13 is controlled to an appropriate level, to reduce the sliding friction between the devices 2 and the support surface 4 of the carrier 1. With a sufficiently small sliding friction, as the push block 12 moves in the X and Y directions towards the reference edges 17, the semiconductor devices 2 which are held by suction cups 13 will also move against the reference edges 17 for alignment.

In FIG. 7B, as the push block 12 moves in both the X and Y directions, the devices 2 which are held by the suction cups 13 move against the guiding edges 19, 20 in the top clamp 18. Due to the flexible nature of the suction cups 13, they can deform in shape as shown in the figure and thus remove the initial misalignment between the device 2 and reference edges 17 to achieve the required alignment.

After alignment, the vacuum pressure of the suction cups 13 can be controlled to fix the devices 2 firmly in the aligned position, so as to prevent dislocation of devices 2 in subsequent processing.

The suction cups 13 preferably comprise an antistatic rubber material to prevent the semiconductor devices 2 from damage by electrostatic discharge.

The above mentioned alignment method is especially suitable for carrier pockets 3 with low profile guiding features. Since the devices 2 are not lifted from the support surface 4 of the carrier pocket 3, it will not cause the device 2 to jump out of the pocket 3 due to the low profile guiding features. It can be difficult for a device 2 to return into the pocket 3 once it is lifted up beyond the guiding features.

Also, this method can be modified to handle carriers with grippers to assist the alignment of devices. FIG. 8 is an isometric view of a carrier 1 comprising grippers 26. This type of carrier 1 has a gripper 26 with a gripper handle 27 as well as built-in reference edges 17 at each carrier pocket 3. The gripper 26 is arranged such that it is biased towards the devices 2 and first pushes the device towards one of the reference edges 17 in the pocket 3, thus one of the device edges is self-aligned. By pushing the gripper handle 27, the grippers 26 will be opened to release the devices 2 from clamping, and the grippers 26 can be restored to the clamping state by their inherent restoring force after releasing the gripper handle 27.

To align the remaining edge of a device 2 in the carrier 1 with a gripper 26, a gripper pusher (not shown) may be integrated with the push block 12. The gripper pusher may be actuated by, for example an air cylinder, to open the gripper 26. The carrier 1 is first flattened by the top clamp 18 and push block 12, with devices 2 held by suction cups 13 in each pocket 1. The gripper pusher then pushes the gripper handle 27 to release the device 2 from the clamping gripper 26. Without the clamping force from the gripper 26, the device 2 is free to align with the remaining reference edge 17 of the pocket as the push block 12 travels. Finally the gripper pusher releases the gripper handle 27 to allow the gripper 26 to restore itself to its clamping state to self-align the devices 2 with the previous reference edge 17 of the pockets 3. In this way, both edges of the devices 2 are aligned.

FIGS. 9A-D illustrate an operation sequence of a method for aligning semiconductor devices 2 in a carrier 1 comprising grippers 26.

In FIG. 9A, the device 2 is clamped by the gripper 26 in the carrier pocket. There is a clearance 28 between the reference edge 17 and the device 2. In FIG. 9B, the gripper pusher (not shown) opens the gripper 26 in the pocket 3 by pushing the gripper handle 27, to free the device 2 from clamping. This creates a clearance 29 between the gripper 26 and the device 2. In FIG. 9C, the push block 12 moves in the X direction, and so the suction cup 13 pulls the device 2 in the same direction to align the device 2 with an X reference edge 17 of the pocket 3. In FIG. 9D, the gripper pusher releases the gripper handle 27. The gripper 26 restores itself to its clamping state to self-align the device 2 with the Y reference edge 17 of the pocket 3, while the left edge of the device 2 is still held in close contact with the left guiding edge of the carrier by the restoring force induced by the flexible suction cup 13.

FIG. 10 is an isometric view of a push block 12 according to a second preferred embodiment of the invention, with rigid suction rings 30 mounted on the push block 12 for alignment of semiconductor devices 2.

As described above, a well-controlled height of the carrier support surface 4 is critical for alignment of devices 2 as well as for subsequent processing, like screen printing. However, some kinds of carriers, especially plastic carriers, may not able to provide the required consistent height of the various carrier support surfaces 4 due to the limitations of the fabrication process or the high fabrication cost involved for good carrier dimensional control.

To handle this kind of carrier, there is another embodiment of the invention, with suction cups replaced by holders comprising rigid holding surfaces, preferably in the form of rigid enclosed suction rings 30. Each rigid holding surface or ring 30 is machined with a center cavity to provide suction to a device 2 from its bottom side. The push block 12 moves upward with the rigid suction ring 30 vacuum on. The rigid suction ring 30 lifts up the device 2 to a height above the device support surface 4 of the carrier 1, with the device 2 still bounded by the guiding features of the carrier pocket 3. The height of the top surface of each rigid suction ring 30 is well controlled to provide a consistent height for each device 2.

Prior to alignment of semiconductor devices 2, vacuum pressure of the rigid suction rings 30 is controlled to an appropriate level, to reduce the sliding friction between the devices 2 and suction rings 30. As the push block 12 moves towards the reference edges 17 in both the X and Y directions, the semiconductor devices 2 which are held by the suction rings will also move against the reference edges 17 for alignment. With a sufficiently low sliding friction, unaligned devices 2 can slide and orientate relative to the rigid suction rings 30 to remove any initial misalignment with respect to the reference edges 17. The result is alignment of all devices 2 in the carrier 1 simultaneously. Also, as the devices 2 are supported on the top surfaces of the rigid suction rings 30, the heights of the devices 2 can be well controlled.

The reference edges can be provided by the carrier 1 or by the top clamp 18. For the latter, the lower part of the guiding edges 19, 20 are inclined outwards so as to reduce the likelihood of tilting of the devices 2 when the devices 2 are being raised into the boundary defined by the guiding edges 19, 20 for the subsequent alignment actions.

FIGS. 11A-B show top and side views of a rigid suction ring 30 of the push block 12 performing alignment of a semiconductor device 1.

FIG. 11A shows the device 2 prior to alignment. The semiconductor device 2 is lifted from the carrier support surface 4 and is supported on the top surface of the rigid suction ring 30, thus its height can be precisely controlled by the rigid suction ring 30. The heights of the devices 2 will not be affected by poor dimensional control of the carrier 1, but will still be guided by the pockets 3. There is a clearance 24 between the guiding edges 19, 20 and the device 2, a clearance 25 between the conveyor track 22 and the carrier 1, and a clearance 31 between the device 2 and the carrier 1.

FIG. 11B shows the device 2 being aligned with the reference edges 19, 20. The vacuum level of the rigid ring 30 is controlled to an appropriate level in order to achieve a sufficiently small sliding friction. This enables the semiconductor device 2 to slide over the top surface of rigid suction ring 30 and thus be aligned with guiding edges 19, 20 in the top clamp 18 when the push block 12 travels in both the X and Y directions. Accordingly, the semiconductor devices 2 are arranged substantially on a plane on the rigid suction rings 30 instead of the carrier 1, and the actuators 14, 15 are operative to move the push block 12 and rigid suction rings 30 along a plane that is substantially parallel to the plane on which the semiconductor devices 2 are arranged.

After alignment, the vacuum pressure of the suction rings 30 can be controlled to fix the devices 2 firmly in the aligned position.

Similar to the first embodiment of invention, the suction ring approach has a much lower risk of causing device tilting or dislocation during alignment compared to prior art methods. Also, the suction ring vacuum can be used for tilting detection of the semiconductor devices.

Although the suction ring can comprise various types of materials, it is preferable to use metal material with hardened top surfaces, to dissipate any static charges generated and to provide a durable top surface for devices to slide on them.

It would be appreciated that the preferred embodiments of the invention offer more precise methods to align a plurality of semiconductor devices as they serve to minimize the clearance between the devices and reference edges, or may virtually eliminate the need for such clearance. They also do not require special alignment features to be made on the semiconductor devices, such as apertures.

The preferred embodiments of the invention do not involve any vertical guiding interaction between alignment features such as pins or reference edges and the semiconductor devices. Thus, the risk of device tilting or dislocation caused by alignment is reduced. Moreover, the designs are simple and cost effective. Instead of having individual alignment mechanisms for each semiconductor device on the carrier, there is a plurality of flexible suction cups or rigid rings mounted onto a single positioning table to achieve precise alignment of all devices.

Moreover, the alignment methods are fast because all devices in the carrier can be aligned together simultaneously and the alignment methods can be easily adopted by automation means, which makes them suitable for high volume production. By using flexible suction cups mounted on the push block, the first embodiment is further capable of handling carriers with low-profiled guiding features for the devices. By using rigid suction rings with dimensional height control at the push block, the second embodiment is further capable of handling carriers for which the device support surfaces in the carrier pockets have poor dimensional height control. To minimize carrier warpage, the preferred embodiments of the invention also offer the advantage of being able to flatten and even out any warpage of the carrier for more accurate alignment of devices.

The invention described herein is susceptible to variations, modifications and/or additions other than those specifically described and it is to be understood that the invention includes all such variations, modifications and/or additions which fall within the spirit and scope of the above description.

The invention claimed is:

1. Apparatus for individually aligning a plurality of semiconductor devices in a desired orientation within respective separate pockets on a carrier, each of the pockets being sized relative to the semiconductor devices to allow freedom of movement of the semiconductor devices therein, the apparatus comprising:
    separate alignment guides associated with each pocket and arranged to define the desired orientation;
    a positioning device comprising a plurality of holders, each holder being configured to generate a force to hold an individual semiconductor device within its respective pocket; and
    actuators operative to move the positioning device and holders to bias the individual semiconductor devices within their respective pockets against the alignment guides to the desired orientation.

2. Apparatus as claimed in claim 1, wherein the plurality of semiconductor devices is arranged substantially on a plane, and the actuators are operative to move the positioning device and holders along a plane that is substantially parallel to the plane on which the semiconductor devices are arranged.

3. Apparatus as claimed in claim 1, including openings formed in the carrier for the holders to extend through the carrier to hold the semiconductor devices.

4. Apparatus as claimed in claim 1, wherein the holders are operative to hold the semiconductor devices by vacuum suction force.

5. Apparatus as claimed in claim 4, wherein the holders comprise resilient holding surfaces.

6. Apparatus as claimed in claim 5, wherein the resilient holding surfaces are made of anti-static rubber material.

7. Apparatus as claimed in claim 4, wherein the holders comprise rigid holding surfaces with central cavities.

8. Apparatus as claimed in claim 7, wherein the rigid holding surfaces are made of metal and each rigid holding surface has a hardened top surface.

9. Apparatus as claimed in claim 7, wherein the rigid holding surfaces have top surfaces that are coplanar.

10. Apparatus as claimed in claim 1, wherein the alignment guides comprise at least two reference edges formed on the carrier for aligning a semiconductor device in at least two directions.

11. Apparatus as claimed in claim 1, including, a clamping plate positionable onto the carrier and operative to apply a leveling force to flatten the carrier.

12. Apparatus as claimed in claim 11, wherein the clamping plate comprises openings corresponding to positions of the respective pockets on the carrier, whereby the semiconductor devices are accessible through the clamping plate after engagement of the clamping plate to the carrier.

13. Apparatus as claimed in claim 11, including flexible stoppers coupled to the clamping plate for engaging the carrier and applying the leveling force.

14. Apparatus as claimed in claim 11, wherein the alignment guides comprise at least two guiding edges mounted on the clamping plate for aligning a semiconductor device in at least two directions.

15. Apparatus as claimed in claim 1, including grippers coupled to the carrier that are operative to contact and apply a force on at least one side of a semiconductor device towards at least one of the alignment guides and movable away from the semiconductor device to release it.

16. Apparatus as claimed in claim 1, including rigid pins coupled to the positioning device for supporting the carrier when the holders are holding the semiconductor devices.

* * * * *